United States Patent
Najafi et al.

[11] Patent Number: 6,140,144
[45] Date of Patent: Oct. 31, 2000

[54] METHOD FOR PACKAGING MICROSENSORS

[75] Inventors: Nader Najafi; Sonbol Massoud-Ansari, both of Ann Arbor, Mich.

[73] Assignee: Integrated Sensing Systems, Inc., Ypsilanti, Mich.

[21] Appl. No.: 08/839,495

[22] Filed: Apr. 14, 1997

Related U.S. Application Data

[60] Provisional application No. 60/022,496, Aug. 8, 1996.

[51] Int. Cl.[7] .................................................... H01L 21/00
[52] U.S. Cl. .............................. 438/53; 438/54; 438/106; 438/108
[58] Field of Search .................................... 257/417, 418, 257/419, 778, 779, 780; 438/51, 53, 54, 106, 108; 73/706, 708, 720, 721, 725, 726

[56] References Cited

U.S. PATENT DOCUMENTS

| | | | |
|---|---|---|---|
| 4,763,098 | 8/1988 | Glenn et al. | 338/4 |
| 4,838,089 | 6/1989 | Okada et al. | 73/727 |
| 5,209,122 | 5/1993 | Matly et al. | 73/727 |

(List continued on next page.)

FOREIGN PATENT DOCUMENTS

| | | |
|---|---|---|
| 543430 | 10/1992 | European Pat. Off. . |
| 553725 | 8/1993 | European Pat. Off. . |
| 736757 | 10/1996 | European Pat. Off. . |
| WO 98/05935 | 2/1998 | European Pat. Off. . |
| 2-278872 | 11/1990 | Japan . |
| 3-71030 | 3/1991 | Japan . |
| 5-259420 | 10/1993 | Japan . |

OTHER PUBLICATIONS

Flip Chip Technologies, John H. Lau, McGraw–Hill.
Meida Compat. Packg. and Environ. Testg. of Barrier Coating Encap. Silicon Press. Sensor.
Smart MEMS: Flip Chip Integration of MEMS and Electronics—K.W. Markus et al., 1995.
Characterization Study of Flip Chip Integration for MEMS—Dhuler et al., 1996.
Dept. of Electrical Engineering & Computer Science, University of Michigan, Poplawski et al.
Low–Cost, High–Vlume Pack. Techn. for Silicon Sensors & Actuators, Mallon et al. 1988 IEEE.
Micromechanics, Bouwstra et al., The Netherlands Mar. 20–21, 1996.

(List continued on next page.)

*Primary Examiner*—John Guay
*Assistant Examiner*—Alonzo Chambliss
*Attorney, Agent, or Firm*—Harness, Dickey & Pierce, P.L.C.

[57] ABSTRACT

A method for packaging and protection of sensors, particularly so called microsensors is disclosed. A sensor unit (either a sensor chip or sensor package) is flip chip bonded to a substrate having a through hole, such that the sensing element is placed above the through hole. An underfill material is applied in such a way that due to capillary forces, the entire common area between the sensor and the substrate is completely filled, while the sensing element is not covered by the underfill material. This provides an effective way of sealing the sensing element from the side of the package containing the electronics. For a sensor chip that has been through a first level packaging process, the above mentioned method can still be used for bonding the sensor package to a substrate containing an access hole. For some applications one or multiple layers of protective coatings can be deposited on either one side or both sides of the sensor package for protection against the operating environment. For applications where the sensor is required to operate in a controlled pressure/controlled gas environment, a cavity can be created into the substrate, and the sensor chip can be flip chip bonded (and/or sealed) to the substrate in a controlled environment. An alternative method of packaging is disclosed where the sensor chip is fixed onto the substrate, and a cap is bonded to this substrate using dummy bumps for mechanical strength.

103 Claims, 11 Drawing Sheets

U.S. PATENT DOCUMENTS

| | | | |
|---|---|---|---|
| 5,285,690 | 2/1994 | Koen et al. | 73/727 |
| 5,591,679 | 1/1997 | Jakobsen et al. | 438/51 |
| 5,600,071 | 2/1997 | Sooriakumar et al. | 73/721 |
| 5,646,072 | 7/1997 | Maudie et al. | 438/51 |
| 5,721,446 | 2/1998 | Kobayashi | 257/419 |
| 5,889,211 | 3/1999 | Maudie et al. | 73/720 |
| 5,994,161 | 11/1999 | Bitko et al. | 438/53 |

OTHER PUBLICATIONS

Fabrication Tech. for Wafter Through–Hole Interconnections . . . , Linder et al.

Flip Chip Tech. With Conductive Adhesives in Multi–Ship Modules, Kriebel et al.

METHOD FOR PACKAGING MICROSENSORS

CROSS REFERENCE TO RELATED APPLICATION

This application claims the benefit of Provisional Application Serial No. 60/022,496, filed Aug. 8, 1996.

GOVERNMENTAL SUPPORT

This invention was developed in part by funding under Contract No. DAAH01-96-R036, issued by U.S. Army Missile Command. The U.S. Government may have certain rights in this invention.

BACKGROUND OF THE INVENTION

Sensors have been under intense development during the last two decades, and many devices have been developed and commercially produced. Micromachined sensors (hereinafter just "microsensors") are sold worldwide in very large volumes, and are used in a wide variety of application areas. One of the most important manufacturing steps for the mass production of microsensors is the packaging which effects reliability, cost, and performance of such microsensors. Indeed, for many sensors, packaging is the least developed manufacturing step. In particular for a multi-sensor project, which is comprised of a variety of sensors and electronic chips, packaging problems are magnified. Packaging of sensors that are exposed to the ambient environment, such as pressure, flow and gas sensors, demands special attention. The pads and electrical connections to the sensor chip must be protected from the ambient environment while the sensing elements must be exposed to the ambient environment. The wire bonds and pads must be protected (e.g. encapsulated) while allowing the sensing element to be exposed. Traditionally, the wire bonds and pads have been protected from the environment, by depositing a protective coating on them. For example in a paper by D. J. Monk et al. titled *Media Compatible Packaging and Environmental Testing of Barrier Coating Encapsulated Silicon Pressure Sensors*, Proceedings of the 1996 IEEE Solid State Sensors and Actuators Workshop, the use of materials such as fluorosilicone gels and parylene as barrier coatings for protection of sensors from corrosive environments are mentioned. These methods however only address the problem of protecting the wire bonds and pads and do not address the overall issue of packaging of microsensors. In addition, these methods are not very effective for many applications.

Prior art for packaging of pressure sensors typically includes isolating the sensing element from the ambient environment, by securing an stainless steel diaphragm around the sensing elements. These diaphragms are generally either welded to the sensor package or held in place using some form of epoxy. In a paper by J. Mallon et al. titled *Low-Cost, High Volume Packaging Techniques for Silicon Sensors and Actuators*, Proceedings of the 1988 IEEE Solid State Sensor and Actuator Workshop, a method of packaging sensors for harsh environments is disclosed, where a metal isolation diaphragm is used between the pressure medium and the sensor. An incompressible liquid, for example silicone oil can be used then to transfer the pressure to the sensing element. Using this packaging method, the ambient environment condition information, such as pressure, flow rate etc., are transferred to the sensor, while protecting the sensing elements from direct exposure to the environment. However, a certain degree of accuracy is lost during the transfer between the diaphragm and sensing element. Also in applications where epoxies are used for bonding the stainless steel diaphragm, the epoxies may not be resistant to the operating environment, which would cause the packaging to fail in corrosive environment. Thermal mismatch between the epoxies and the diaphragms would also be a source of problem in the above mentioned packaging method.

Microsensors often have a low output signal, which requires the use of electronics for amplifying the signals received from the sensors. These electronic circuits need to be placed as close to the sensor as possible to minimize the unwanted effects of stray signals. K. Markus et al. in *Smart MEMS Flip Chip Integration of MEMS and Electronics Proceedings SPIE Smart Structures and Materials*, 1995 discuss a method where the electronics and the Micro-Electro-Mechanical Systems (MEMS) are fabricated on separate substrates, and are then connected using flip chip bonding. However they suggest that for applications where the front surface of the MEMS chip needs to be exposed flipping the MEMS chip onto the substrate cannot be used. To avoid this problem, two different methods were proposed in that paper. They claim that "This can be avoided by 1) using wafer through holes and having the solder wettable pads on the back of the chip, or 2) designing the MEMS die to be the larger bottom chip, placing the flipped electronics die to the side of the area requiring exposure." The problem with the first method proposed above is that the size of the package is increased unnecessarily. The other method proposed above, which is the method of using wafer through holes for transferring the electric connections from the front side of the sensor chip to the back side of the sensor chip, has been originally proposed by S. Linder et al. in *Fabrication Technology for Wafer Through Hole Interconnections and Three-Dimensional Stacks of Chips and Wafers*, Proceedings, IEEE MEMS Workshop, Oiso, Japan, January 1994. This method however results in adding to the processing complexity. Any step which increases the complexity of the process, leads to reducing the yield and increasing the production costs. In addition, using the above mentioned method, the top part of the sensor package including parts of the electrical connections are exposed which would cause problems if the sensor is required to operate in a corrosive environment.

In another paper by S. Bouwstra presented as an invited talk at National Sensor Conference, Delft, The Netherlands, March 1996, packaging of microsensors is discussed. The methods proposed in this paper are either the conventional die bonding approach (active side facing the surroundings) or a flip chip approach (active side facing the substrate). However the methods described in this paper all require multiple vertical feedthroughs with high wiring density in through holes, which is again a highly complex process which adds to the complexity of the packaging scheme. Another proposed idea in the paper mentioned above, involves bonding the transducer chip to a circuit chip, while establishing electrical connections between the two. Different techniques such as eutectic bonds, solder bumps and isotropic and anisotropic adhesives are discussed. Also mounting the entire assembly onto a substrate is mentioned, which would again require use of vertical through holes and result in adding highly complex fabrication steps to the packaging process. Once again as mentioned above, each step that adds to the complexity of the process will result in reducing the yield and increasing the cost of the process.

A method for packaging of chemical sensors is discussed in a paper by M. E. Poplawski et al. titled *A Simple*

*Packaging Process for Chemical Sensors, Proceedings of the* 1994 *IEEE Solid State Sensors and Actuators Workshop.* The chemical sensors are packaged by flip chip bonding the sensors to glass substrates which contain fluid channels. The sensors are fabricated on silicon substrates, using a sequence of CMOS compatible semiconductor process steps. Precision screen printing is used to deposit a polymer gasket on the sensor chip, to act as a channel sealant. The sensor chip is inverted over the substrate and mounted over the flow channel in a way that the sensing element is positioned over the fluid channel. The polymer that was screen printed on the sensor chip, around the sensing element, seals the channel by acting as a gasket at the silicon-substrate interface. A similar concept is discussed in a paper by F. Kreibel et al. titled *Flip Chip with Conductive Adhesives in Multichip Modules*, published in the Proceedings of the Symposium on Conductive Adhesives in Microelectronics, Berlin, 1994. In this paper, an ion selective field effect transistor (ISFET) chip, is bonded to a fluidic capillary, using flip chip bonding. The fluidic capillary is formed by attaching a silicon spacer chip to a second silicon substrate, both containing through-holes. This silicon piece is attached to a glass substrate, thus forming a fluidic capillary. The ISFET chip is bonded to the fluidic capillary piece using flip chip bonding. A polymer gasket is screen printed on the ISFET chip, to seal the channel. Both of the papers mentioned above have been referenced in a book titled, Flip Chip Technologies, John Lau, Editor; Mc Graw-Hill, 1996.

In the two papers mentioned above, screen printing of polymers is used as a means for sealing off the flow channel, and protecting the rest of the package. This method may work for selected applications, however many problems can arise from the interaction of the polymer with the operating environment. One of the main problems is that most polymers exhibit a finite permeability to moisture. In most cases, the channel seal eventually fails because of interface modifications due to moisture penetration. In addition, the polymer might not be resistant to corrosive environments where the sensor might be required to operate in. Another problem arises from the fact that the screen printing process for fabricating the polymer gasket requires additional masks and processing steps. As mentioned previously, adding steps to any manufacturing process results in higher costs and lower yields.

SUMMARY OF THE INVENTION

This invention describes a method for packaging and protection of sensors, in particular microsensors. In this method, a sensor chip is bonded to a substrate containing a through hole or cavity, using flip chip bonding. The bonding is done such that the sensing element from the sensor chip is placed above the through hole on the substrate, and is thus in contact with the operating environment. Underfill material or another material is used to fill the gap between the sensor chip and the substrate. A key element in this disclosure is that the underfill is applied in a way that due to capillary forces, the entire common area between the sensor chip and the substrate is filled, without having the underfill material cover the sensing element. The underfill material can be applied from either the front side or the backside of the substrate. The amount of underfill material applied needs to be properly determined in order to have the underfill completely fill the gap between the sensor chip and the substrate, without covering the sensing element itself. This method is especially suitable for applications where the sensing element needs to be in direct contact with the operating environment. In addition, since the underfill material is applied in a manner that the entire common area between the substrate and the sensor chip is filled, the sensing element is completely sealed off from the side of the package containing the electronics.

It should be noted that this method can also be applied to cases where the sensor chip has already been through a first level packaging process. This sensor package can then be bonded to a substrate containing a hole, using the flip chip bonding method followed by the underfill process described above.

In cases where the underfill material is not resistant to the operating environment of the sensor, an additional encapsulant layer can be selectively deposited, through the access hole of the substrate, to cover the exposed parts of the underfill material, with or without covering the sensing element. The above mentioned method is also suitable for monolithic sensors and hybrid packaging of sensors and electronics.

The packaging technique mentioned above can also be applied to the case where the electronics are either included on the same sensor chip (monolithic sensor) or fabricated on a separate chip, but included in the same package (hybrid packaging). In the case of hybrid packaging, the electronics can be either flip chip bonded or wire bonded to the substrate. For some applications where the sensing element needs to be in direct contact with the environment, a protective coating can be selectively deposited on the side of the package containing the electronic components. Similarly, if the sensing element needs to be protected from the environment, but some of the electronic components are not compatible with the coatings, the protective coating can be selectively deposited on the side of the package containing the sensing element. If the entire sensor package needs to be protected from the operating environment, one or several layers of protective coating can be deposited on the entire package. It should be noted that the coatings on the sensing element side do not necessarily have to be the same as the coatings on the electronics side of the package.

In another aspect of the invention, metal lines that transfer the signals from the sensing element to bonding pads can be protected from exposure to the environment, by either depositing a protective coating on them, or having a cover (tunnel) fabricated which extends from the rim of the sensing element to beneath the underfill material. The advantage of this method is that the metal lines are completely sealed off from the environment, without adding complicated processing steps.

In another aspect of the invention, for sensors that are required to operate in a controlled pressure or controlled gas environment, the substrate to which the sensor chip is bonded, contains a cavity as opposed to a through hole. In this method the underfill application needs to be done in a controlled environment. Also the amount of underfill material applied needs to be characterized in order to have the underfill completely fill the gap between the sensor chip and the substrate, without covering the sensing element itself. This method would both effectively seal the cavity and the sensing element from the outside environment, and provide a controlled pressure cavity where the sensing element can operate in.

In yet another aspect of the invention the sensor chip can be mounted on the substrate, and wire bonding can be used for transferring the signals from the sensing element to pads on the substrate. A cap can then be bonded to the substrate using the flip chip bonding method explained earlier in this disclosure, using dummy bumps for mechanical strength.

This provides a controlled environment for the sensing element to operate it. This method can also be used for monolithic sensors and hybrid packaging of electronics along with sensors. In the case where the electronics chips need to be incorporated in the package, they can be mounted on the substrate, either inside or outside the cap.

For applications where thermal mismatch between the sensor chip and the substrate might cause problems, a substrate containing a cavity can be used. The sensor chip would be mounted on the substrate on top of the cavity by having at least one side attached to the substrate. Flip chip bonding or wire bonding can be used for transferring signals from the sensor chip to the substrate, and a cap can then be flip chip bonded to the substrate using the method explained earlier in this disclosure. Electronic chips can be also mounted on the substrate, either inside or outside of the cap.

The methods mentioned above may be better understood by reference to the drawings and to the detailed description which follows. It should also be noted that there are many different techniques for flip chip bonding that are well known in the art, and our technique of using flip chip bonding for packaging of sensors is not restricted to any specific flip chip bonding method.

Further objects, features and advantages of the invention will become apparent from a consideration of the following description and the appended claims when taken in connection with the accompanying drawings.

BRIEF DESCRIPTION OF THE DRAWINGS

FIG. 2b illustrates electronic components bonded using either wire bonding or flip chip bonding to the substrate in which the sensor chip is also bonded to.

FIG. 7c is a close up of the dummy bumps with the metal lines passing in between.

DETAILED DESCRIPTION OF THE PREFERRED EMBODIMENT

Figure 1A:
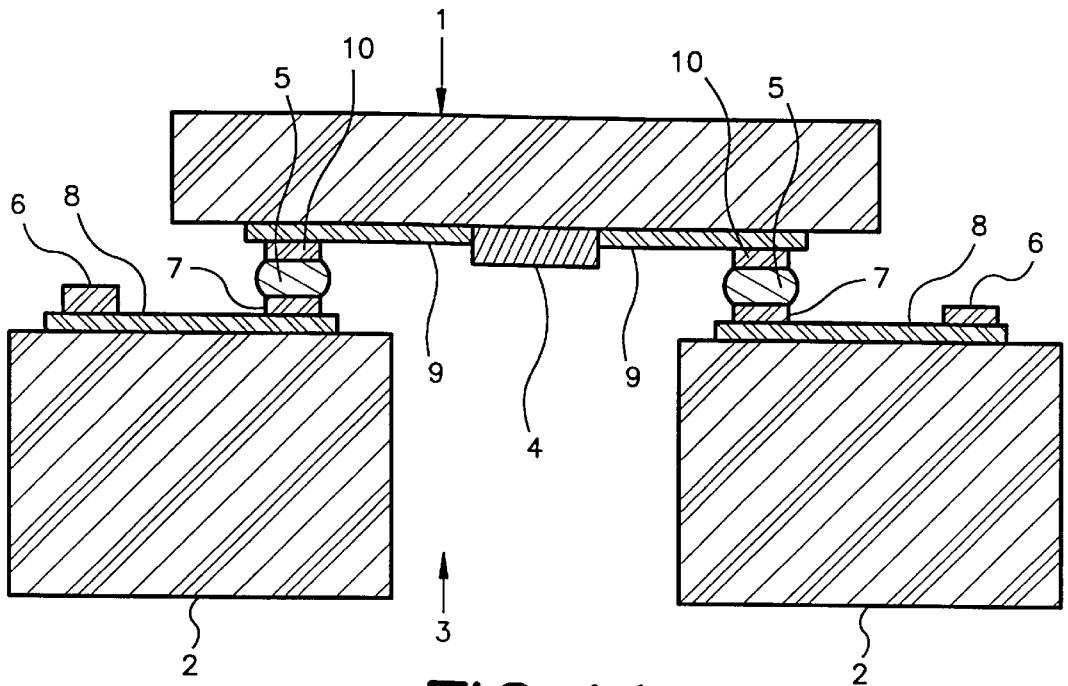
FIG. 1a illustrates a sensor chip flip chip bonded to a substrate having an access hole where the sensing element is positioned above the access hole.

Referring first to FIG. 1a, an access hole 3 is fabricated in a substrate 2 (e.g. ceramic or other suitable material) and metal pads 7, are placed around the access hole 3. These metal pads 7, are connected via metal lines 8 to metal pads 6 on the outer edge of the substrate 2. Various methods can be used to fabricate the metal lines and pads. For example one technique consists of evaporation of a metal layer over the entire substrate, followed by photolithography steps to define the metal lines and pad areas. A variety of other methods can be used, depending on the substrate material and other specific details of the fabrication process. The sensor chip 1 is then flip chip bonded to the substrate 2, while the sensing element 4, (e.g. pressure sensor) is placed on top of the access hole 3. Flip chip bonding generally consists of mounting the sensor chip on a substrate using various interconnect materials and methods (e.g. fluxless solder bumps, conductive polymers) such that the active surface of the sensor chip is facing the substrate.

Figure 1B:
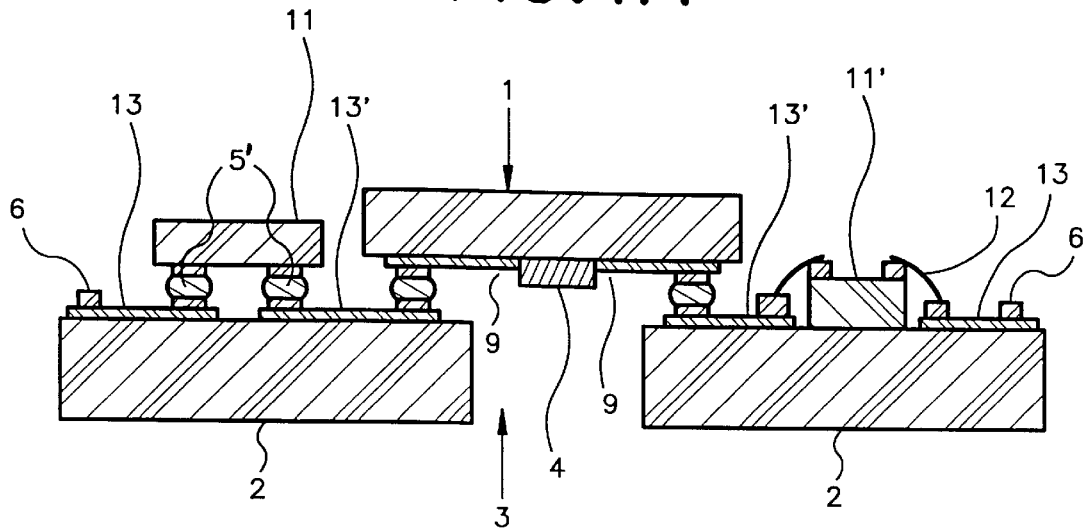
FIG. 1b illustrates bonding of electronic components along with the sensor chip to a substrate having an access hole.

In the event of having electronics along with the sensing element 4, the electronic chips 11 and 11', can be also attached to the substrate 2, using either traditional wire bonding methods or flip chip bonding methods, as shown in FIG. 1b.

Figure 2A:
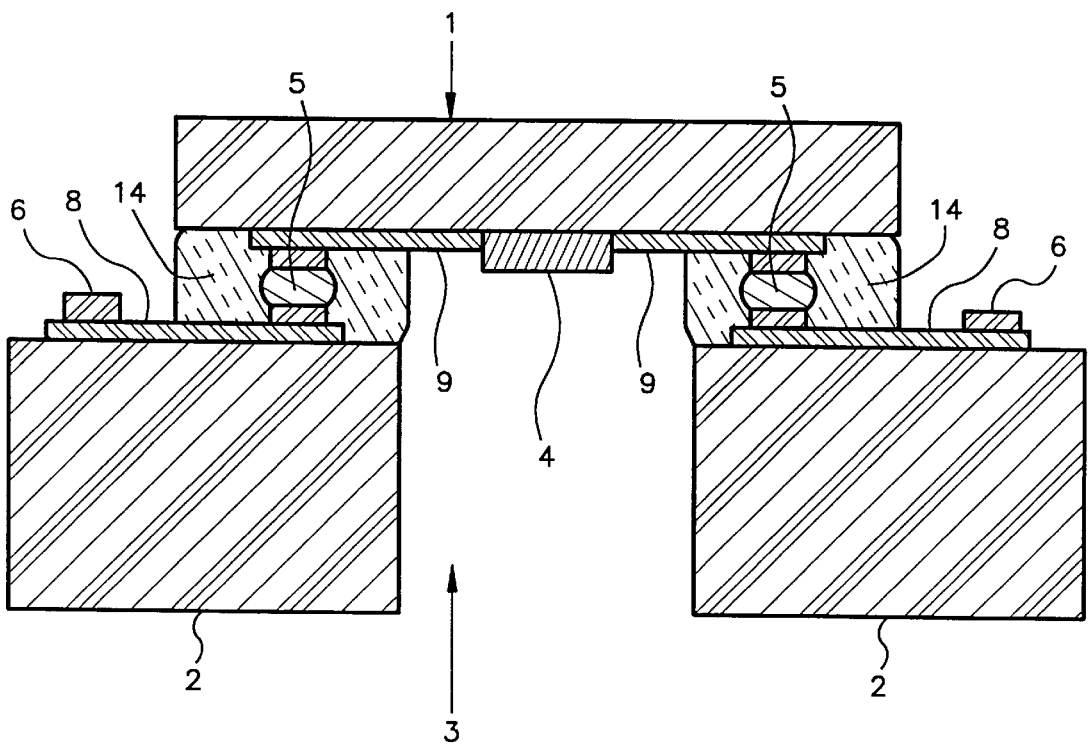
FIG. 2a illustrates underfill material applied between the sensor chip and the substrate such that the underfill material does not cover the sensing element.

An underfill material 14 is then applied to encapsulate the bonding pads, as shown in FIG. 2a. This underfill material 14 can be either a material such as an epoxy, or another material which is compatible with specific processing requirements, such as cure temperature or coefficient of thermal expansion. The underfill material 14 can be applied from either the backside of the sensor chip 1 (i.e. front side of the substrate 2), or from the access hole 3 in the substrate 2. The most important fact is that due to capillary forces the entire common volume between the sensor chip 1 and the substrate 2 is filled with the underfill material 14, without having the sensing element 4 covered by the underfill material 14. With a few tests, the right amount of underfill material 14 can be identified and the process an be characterized. This is a very simple and reproducible process which can be easily automated. In addition, this method ensures that the side of the sensor package containing the sensing element 4 is sealed off from the side of the package containing the electronics.

Figure 2B:
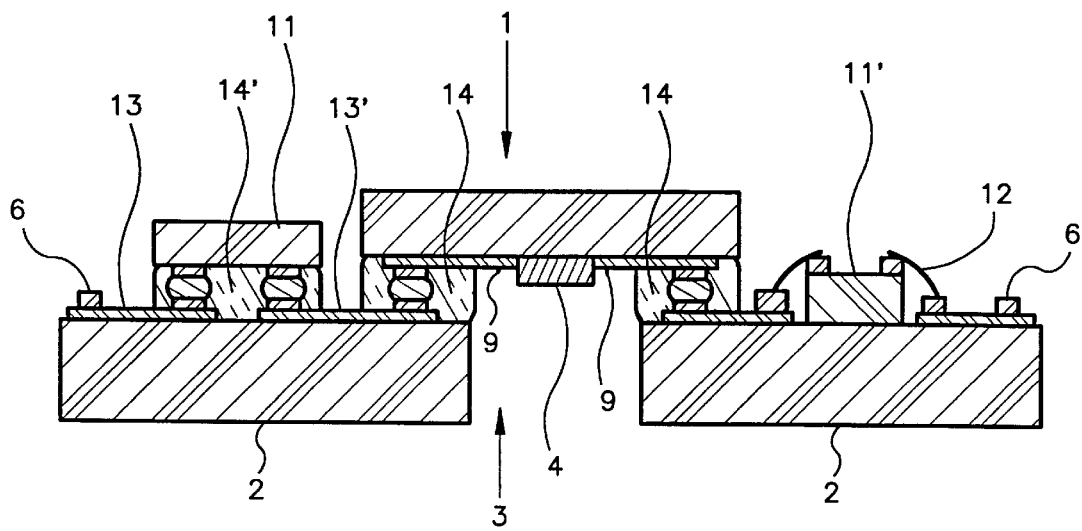

FIG. 2b shows the electrical components 11 and 11' attached to the substrate 2 using either wire bonding 12 or flip chip bonding, as mentioned before. The reason why both types of bonding are shown is that some electronic chips 11' might not be compatible with flip chip bonding methods.

Figure 2C:
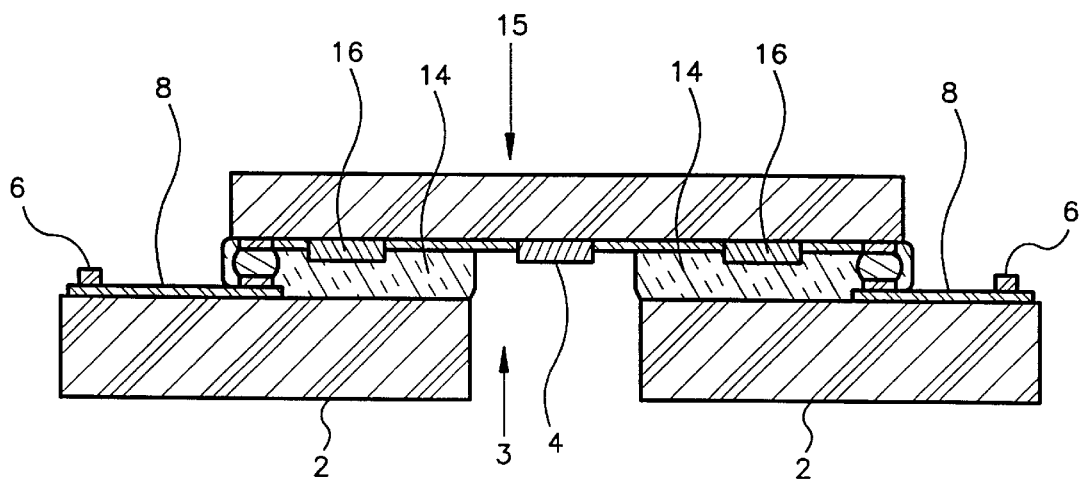
FIG. 2c illustrates a monolithic sensor chip flip chip bonded to a substrate containing an access hole.

In the case of a monolithic sensor 15 where the electronic components 16 are integrated on the same chip as the sensing element 4, the aforementioned flip chip bonding packaging method can also be used for transferring the electric signals from the electronic components 16 to the outside pads 6 of the substrate 2. FIG. 2c shows a monolithic sensor 15 bonded to a substrate 2 using the flip chip bonding packaging method.

Figure 2D:
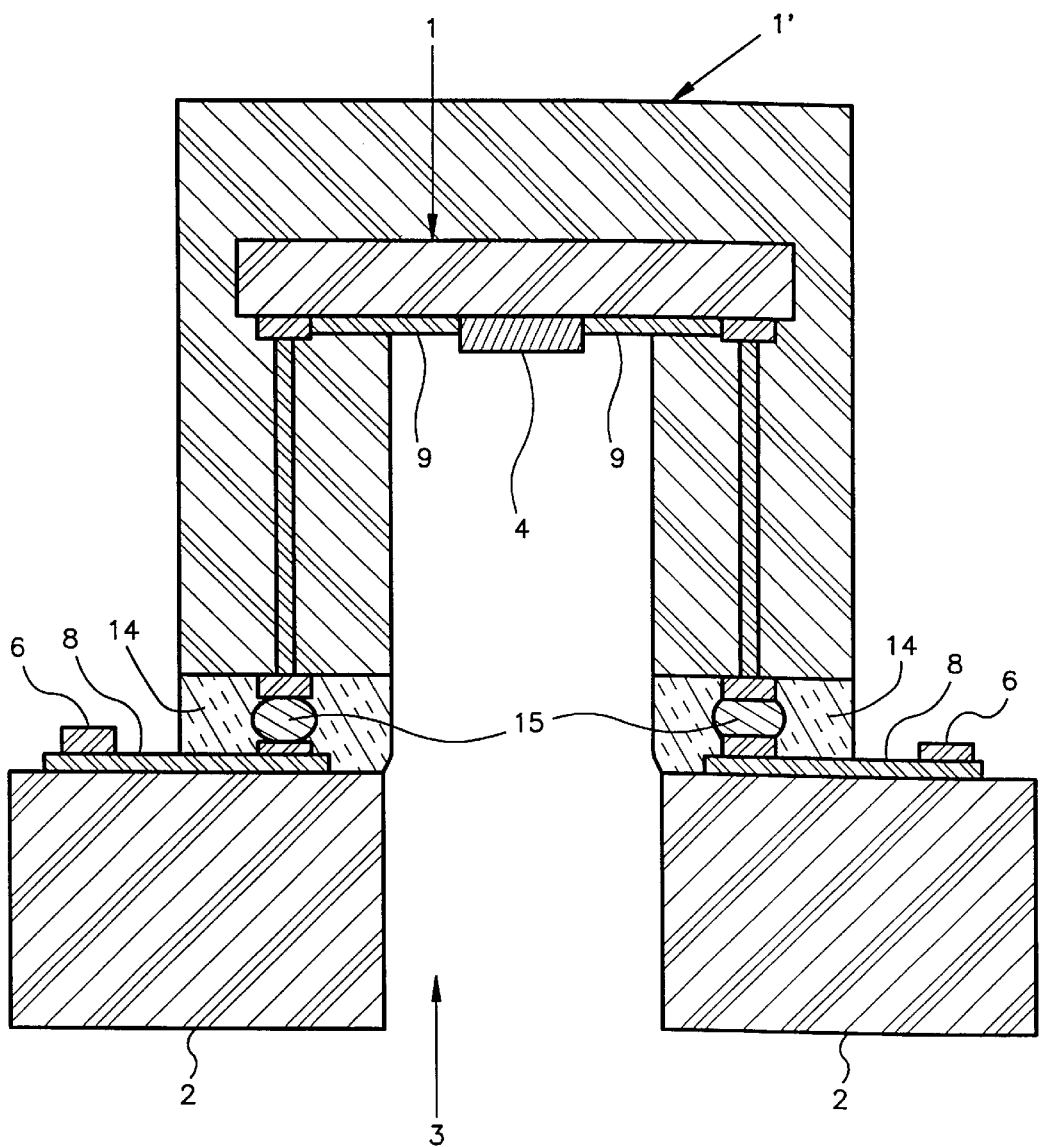
FIG. 2d illustrates a sensor that has been through a primary packaging process. This sensor package is then flip chip bonded to a substrate containing an access hole.
Figure 2E:
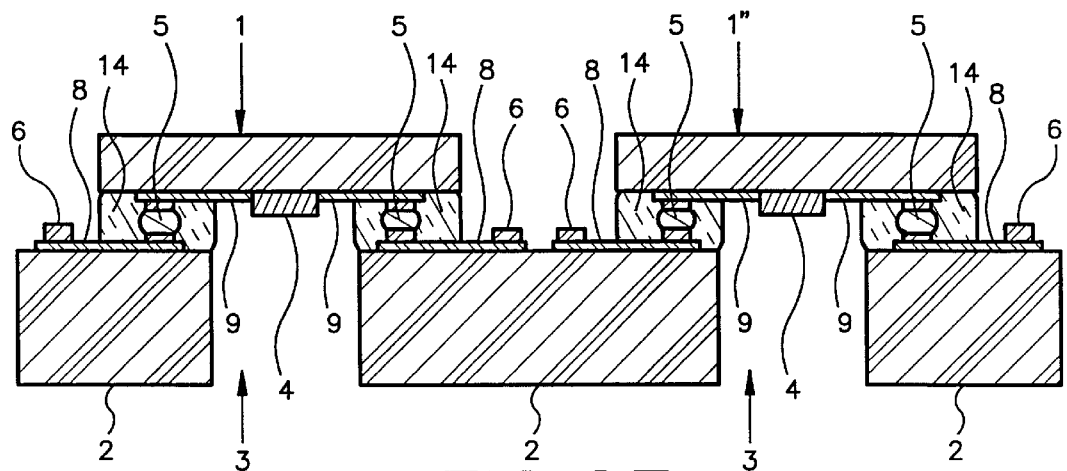
FIG. 2e illustrates several sensor units bonded to a substrate containing multiple access holes.
Figure 2F:
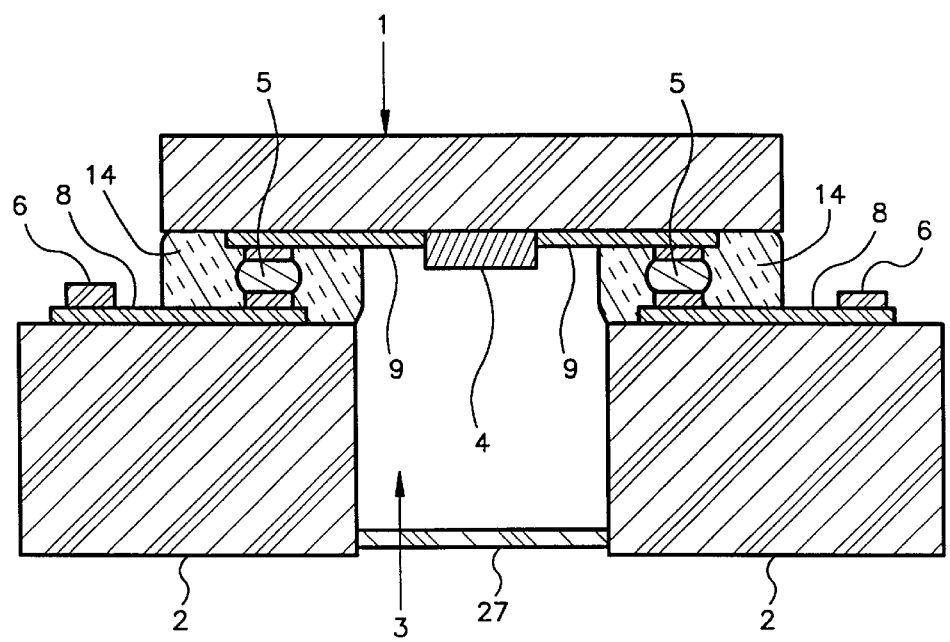
FIG. 2f illustrates a screen secured to the substrate to protect the sensing element from dust and particles.

The packaging method described above can also be used in the case of a sensor chip 1 which has already been through a first level packaging process. This primary sensor package 1' can be flip chip bonded using the aforementioned method, to a substrate 2 containing an access hole 3. This concept is illustrated in FIG. 2d. In addition, if multiple sensor units need to be packaged, a substrate with multiple cavities can be used. The sensors can be mounted on the substrate using the aforementioned methods, such that the sensing elements are located directly above the cavities, as shown in FIG. 2e. It should be mentioned that for some applications, a thin screen 27 can be attached to the substrate in a way that it covers the cavity and prevents dust or particles from falling onto the sensing element. This screen 27 should be designed such that it does not interfere with the operation of the sensor, for example a thin, porous screen can be used for protecting a pressure sensor from particles, or a thin, non-porous screen can be used for protecting an accelerometer from dust or particles. This concept is illustrated in FIG. 2f.

Figure 3:
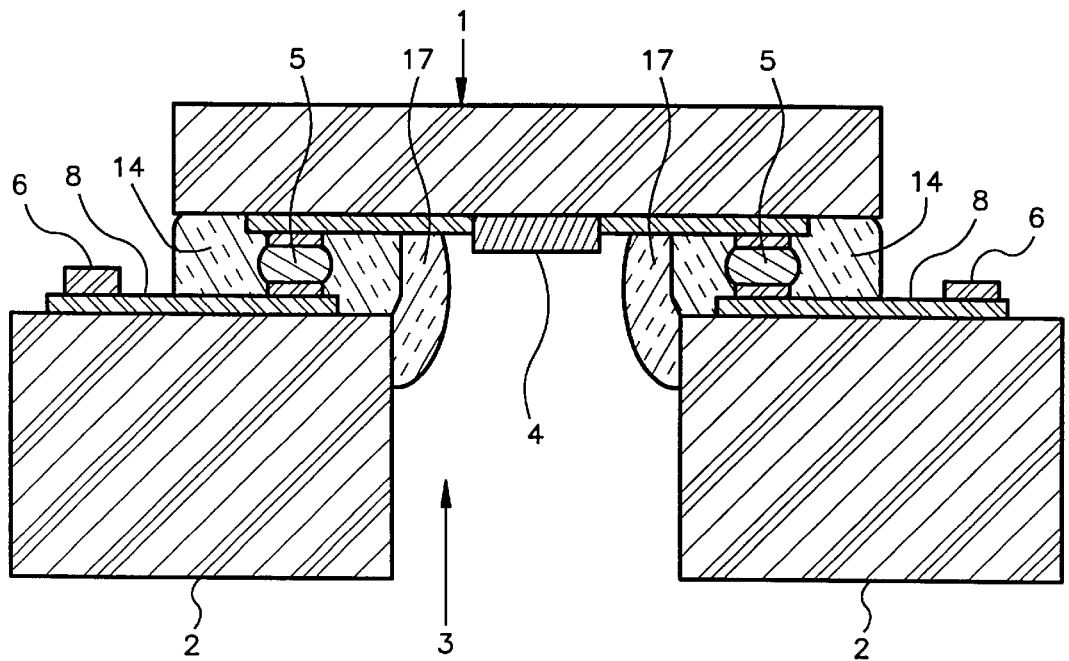
FIG. 3 illustrates additional encapsulation applied for protection of the underfill material against operating environments.

In some applications, the underfill material 14 that is used for the aforementioned flip chip bonding method, is not resistant to the environment that the sensing element 4 is required to operate in. For these applications additional encapsulant material 17 can be deposited at the interface area around the access hole 3, from the front side of the sensor chip 1 (backside of the substrate), to further protect both the underfill material 14, and the bonding pads. This concept is shown in FIG. 3. This encapsulant 17 can be deposited around the bottom side of the access hole 3, very accurately for example by an automated dispenser machine, as commonly used. This method of using additional encapsulant 17 for protection of the underfill material 14, can also be used for either packaging of monolithic sensors or hybrid packaging of electronics chips along with sensors, as mentioned previously.

Figure 4A:
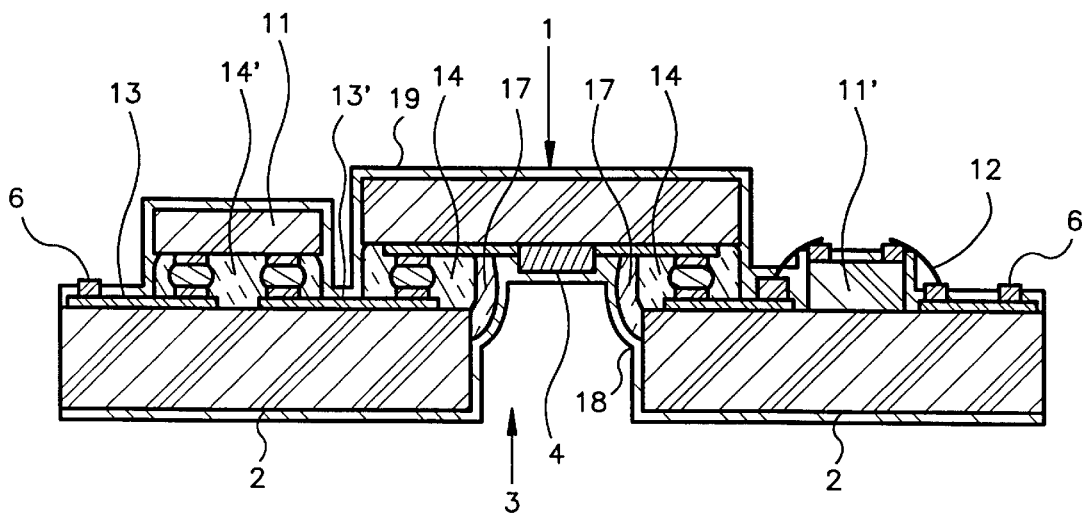
FIG. 4a illustrates one or several layers of protective coating applied to the entire sensor package.

For some applications, both the sensing element and the electronics need to be protected from the operating environment. For these applications, a protective coating layer can be deposited on both sides of the sensor package. For example a layer of SiC or diamond films or other similar coatings can be deposited on the entire sensor package to protect it from a corrosive environment. Also, more than one layer of protective coating can be deposited on both sides of the sensor package. This concept is illustrated in FIG. 4a. It should be noted that if necessary, the coating 18 applied to the sensing element side of the package could be different than the coating 19 applied to the electronics side of the package. The coating material would be selected based on the environmental conditions that the sensing element 4 would be expected to be subjected to. It should be noted that at this stage having the additional encapsulant 17 around the underfill material 14 is optional. In some cases, the encapsulant 17 may be applied around the underfill material 14 after one or more protective layers 18 have been deposited on the side of the package containing the sensing element.

Figure 4B:
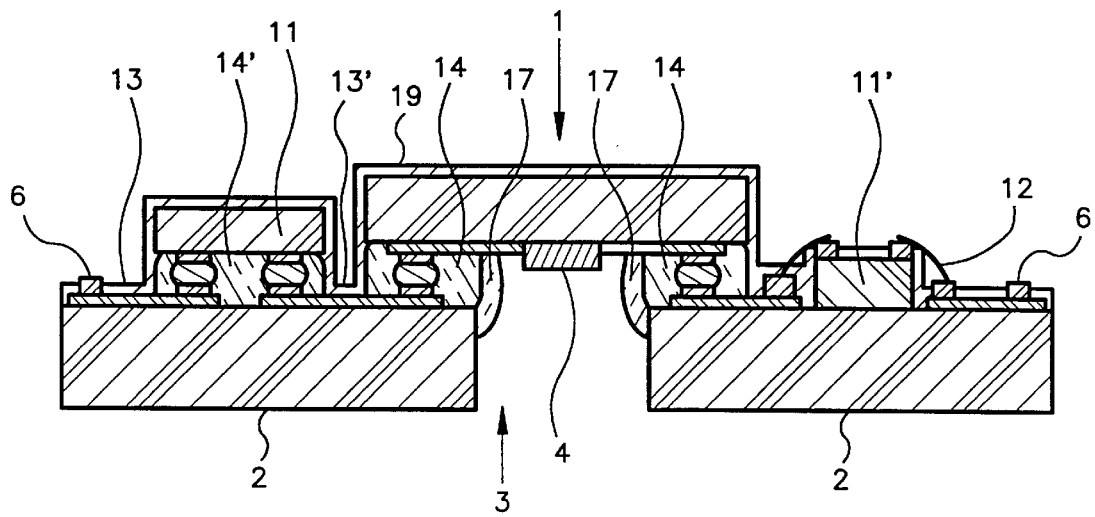
FIG. 4b illustrates one or several layers of protective coating applied selectively to the electronics side of the sensor package.

For some applications, it is necessary that the electronics 11 and 11' be protected from the operating environment, while keeping the sensing element 4 exposed to the environment. For these applications, one or several protective coating layers 19 could be deposited on the front side of the substrate 2, which contains the electronics 11 and 11'. This would result in protecting the front side of the substrate 2 while allowing the backside of the substrate which contains the sensing element 4 be exposed to the operating environment. For example, if we have a gas or humidity sensor, the electronics 11 and 11' can be protected by deposition of a layer such as parylene on the front side of the substrate, while the sensing element 4 for the gas or humidity sensor will not be covered by this parylene layer. FIG. 4b shows a schematic of the concept mentioned above. Having the encapsulant 17 around the underfill material 14 is also optional depending on the operating environment.

Figure 4C:
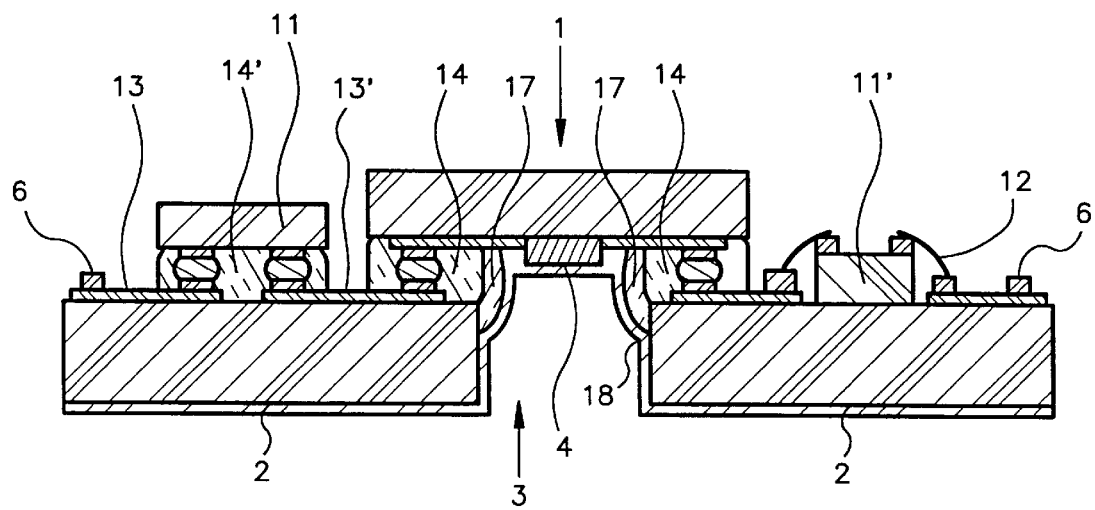
FIG. 4c illustrates one or several layers of protective coating applied selectively to the side of the package containing the sensing element.

In applications where the sensing element 4 operates in a corrosive environment, then one or several protective coating layers 18 can be applied on the entire backside of the substrate 2 containing the access hole 3, as shown in FIG. 4c. In some applications however, where the sensing element cannot be covered, for example a gas sensor, a shadow mask can also be used to selectively apply this blanket protective coating 18. Again, it should be noted that applying the additional encapsulant 17 to protect the underfill material from the environment, is optional at this stage. This encapsulant 17 can be applied before or after the protective coatings 18 are deposited. For example in some cases, the encapsulant 17 may not adhere well to the underfill material 14 so an initial layer of protective coating 18 is deposited over the entire side of the sensor package containing the sensing element 4. This is followed by adding an encapsulant layer 17 around the area containing the underfill material 14. Optionally after applying the first protective coating layer 18 and the encapsulant 17, a second layer of protective coating may be applied over the entire side of the package containing the sensing element.

Figure 5:
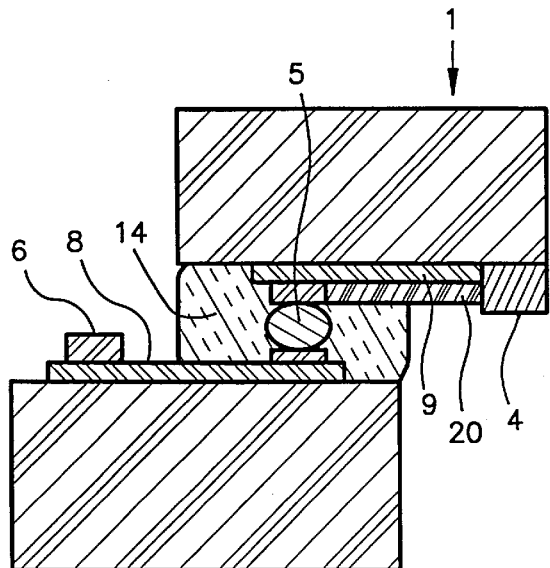
FIG. 5 illustrates a protective coating or a cover (tunnel) over the metal lines for protection against the operating environment.

A method for protecting the pads and electrical connections to the sensing element 4 from the operating environment is shown in FIG. 5. These metal lines 9 can be protected from the environment by several methods. One method is to deposit and pattern one or several protective layers on these lines which would start from the sensing element rim and extend beneath the underfill areas 14. Another method would be to fabricate a cover (tunnel) 20, over the metal lines 9, which would again start from the sensing element rim and extend to the underfill areas 14. It should be noted that part of this protective layer or cover 20 will be covered by the underfill material 14 and optionally by the additional encapsulant 17. In this approach the metal lines 9 are completely protected from the ambient environment. This concept is shown in FIG. 5 which shows the protective layer or cover (tunnel) 20 being partially covered by the underfill material 14. A variety of materials can be used for the protective layer. Also using various techniques, different materials can be used to fabricate a cover or tunnel 20. In some sensor fabrication processes, the cover (tunnel) 20 can be fabricated in the same manufacturing steps as the sensing element 4 thus enabling an efficient and cost effective method for protecting the metal lines 9. For example for microsensors that are fabricated using the p++ (i.e. heavily boron doped silicon) etch stop technique, a p++ silicon cover (tunnel) can be used. Fabrication of this p++ extension does not require any additional processing steps, nor does it increase the sensor chip area. These protective covers 20 can also be fabricated from a variety of other materials (e.g. silicon, glass, etc.).

In all the applications noted above, the processes described are not necessarily limited to a sensor chip 1. If the sensor chip 1, for example a microsensor chip containing at least one microsensor structure has already been through a first level packaging process, this sensor package 1' can be flip chip bonded to a substrate 2 containing an access hole 3 using the aforementioned methods. In addition, if a monolithic sensor or a hybrid sensor has already been through a primary packaging step, this entire primary package containing the sensor chips and the electronics, can be bonded to a substrate using the method described above.

Figure 6:
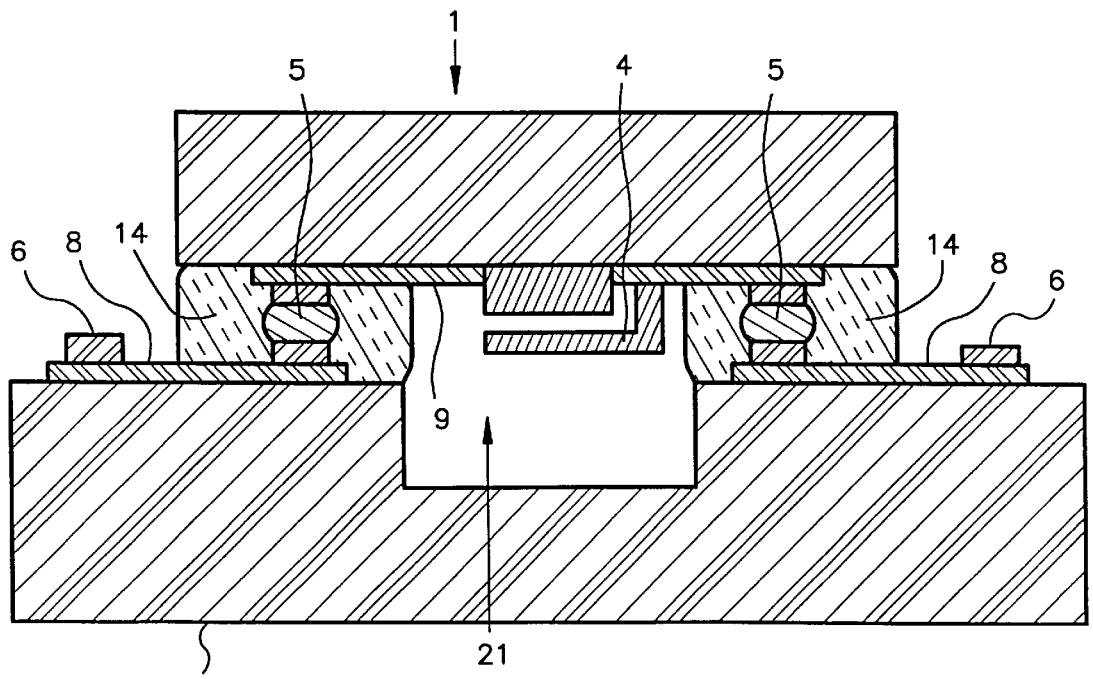
FIG. 6 illustrates a packaging technique for controlled pressure/controlled gas applications using a substrate with a cavity formed therein.

For some applications (e.g. accelerometers or members of the gyroscope family such as tuning forks or yaw sensors) the sensing element 4 needs to operate in a controlled pressure I controlled gas environment. The approach mentioned above can be slightly modified to suit these applications. For pressure controlled sensor packaging, a cavity 21 will be created in the substrate 2, as opposed to an access hole 3 that was mentioned above. The sensing element 4 (e.g. accelerometer) will then be bonded using the flip chip method. Underfill material 14 is then applied from the backside of the sensor chip (front side of the substrate), in an environment where the gas and pressure are controlled. Due to capillary forces the underfill material would fill the entire common gap between the substrate 2 and the sensor chip 1 without covering the sensing element 4. This also provides a very effective method for sealing off the sensing element 4 from the outside environment and providing a controlled pressure/controlled gas environment inside the cavity 26. FIG. 6 shows a schematic of this approach. As mentioned previously, additional encapsulant can be applied around the underfill material 14 and protective layers can be deposited on either side of the package. The aforementioned approach can also be applied for monolithic sensors and hybrid packaging of electronics components along with sensors. For example in a monolithic sensor, the electronic components can be located on the sensor chip in the area above the cavity.

An alternative method for sensor packaging utilizes a cap 22 and a technique similar to the aforementioned flip chip bonding method to provide a controlled pressure environment for the sensing element to operate in. This cap 22 can be made from various materials such as silicon, glass, ceramics, etc. Using dummy bumps 23, the cap 22 can be flip chip bonded to pads on the substrate 2. The underfill method 14 is then followed as previously mentioned. This method of applying the underfill material allows the area under the cap to be sealed off, thus providing a controlled pressure environment for the sensing element to operate in. The conductive pads 24 on the sensor chip 1 would be wire bonded 12 to pads 25 on the substrate 2. Metal lines 8, would then transfer the electric signals from these pads 25 to pads 6 located on the outside edge of the substrate 2. It is important that the distance between the bumps 23 to be large enough to allow the metal lines 8 to pass in between, yet this distance needs to be small enough to allow the underfill material 14 to fill the gap between the cap 22 and the substrate 2. Electronic circuits can be either fabricated on the same sensor chip 1, or fabricated separately and attached to the substrate 2, either inside or outside the cap 22. Also additional encapsulant material can be deposited around the underfill material to protect it from the environment. The metal lines 8 can also be protected either by fabricating a cover (or tunnel) or by depositing one or several protective layers.

Figure 7A:
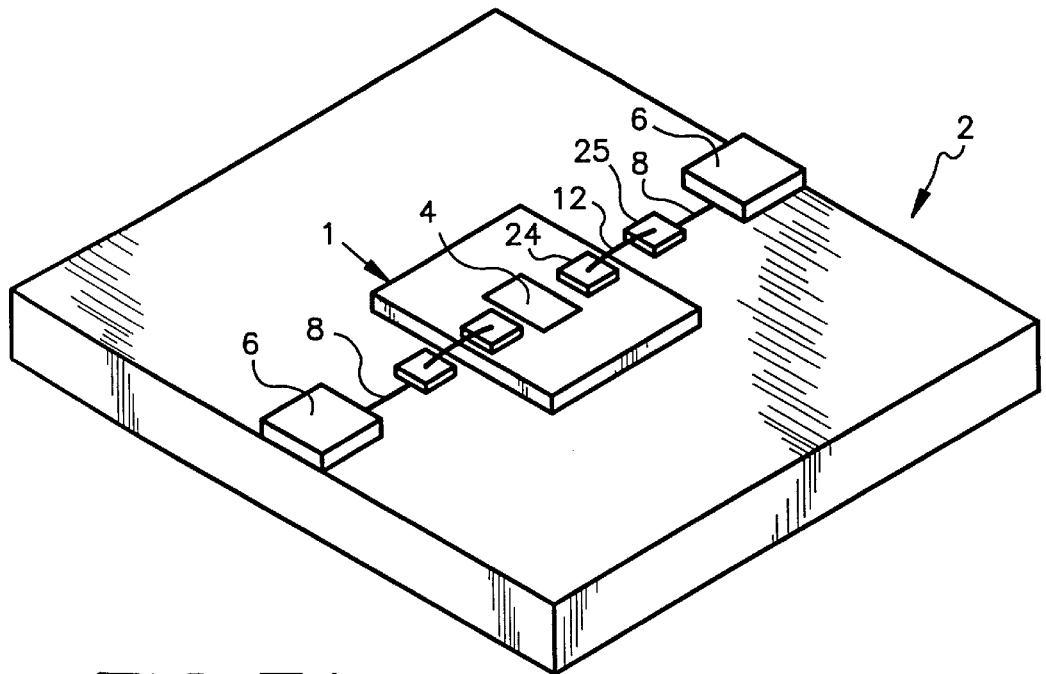
FIG. 7a illustrates a sensor chip attached to a substrate, with the sensor pads wire bonded to pads on the substrate.
Figure 7B:
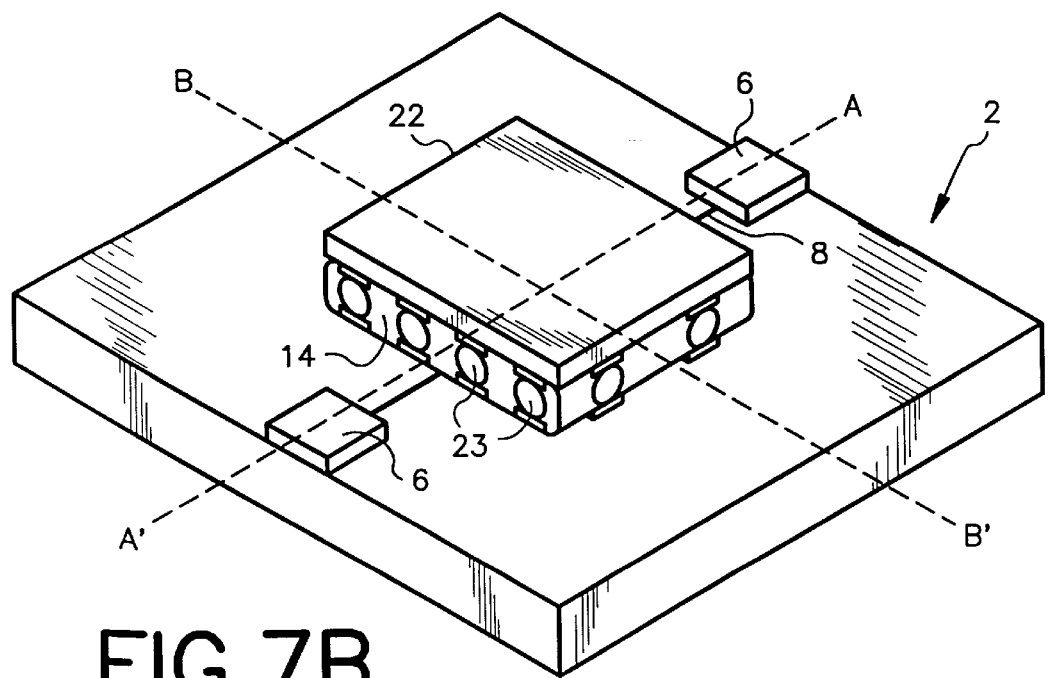
FIG. 7b illustrates a cap over the sensor chip flip chip bonded to the substrate using dummy bumps, for use in a controlled environment.
Figure 7C:
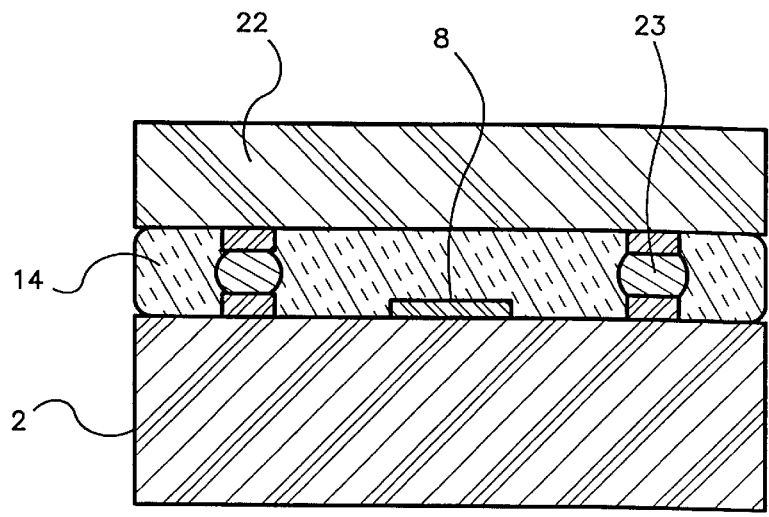

FIG. 7a shows the sensor chip i attached to the substrate 2, with the sensor pads 24 wire bonded 12 to pads 25 on the substrate 2. These pads 25 are then connected via metal lines 8 to pads 6 on the periphery of the substrate 2. FIG. 7b shows a cap 22 that has been bonded to the substrate 2, using the aforementioned bonding method with dummy bumps 23, for use in a controlled pressure environment. As shown in this figure, the underfill material 14 covers the metal lines that connect the inner pads to outer pads 6 on the periphery of the substrate. A close up of the cross section of the dummy bumps 23 with the metal lines 8 in between is shown in FIG. 7c.

Figure 7D:
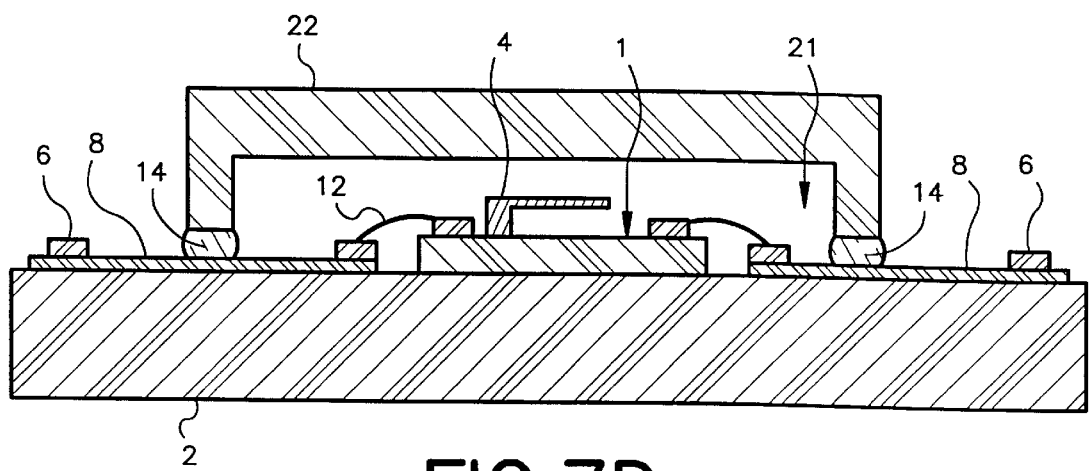
FIG. 7d is the cross section AA' (as shown in FIG. 7b) of the sensor package.
Figure 7E:
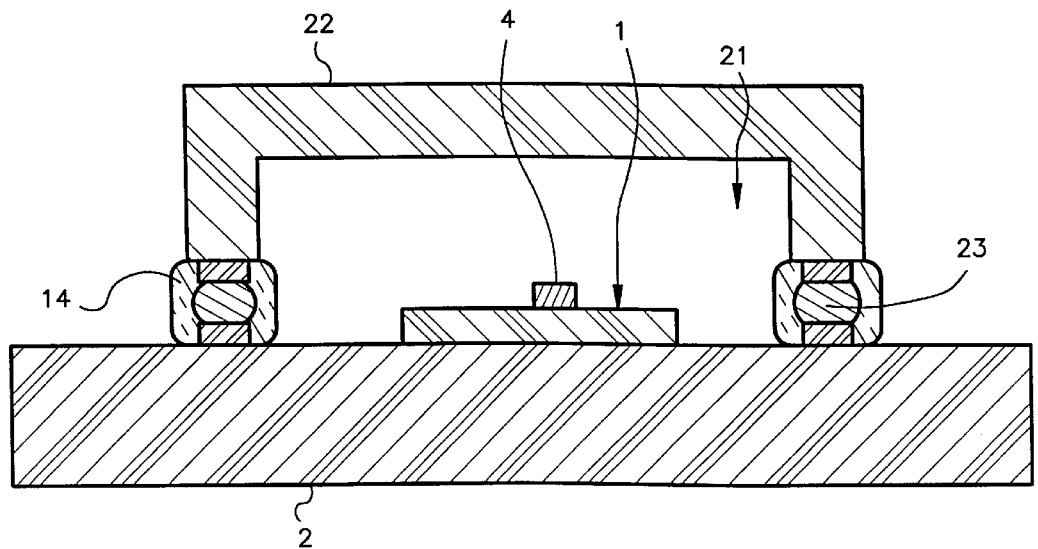
FIG. 7e is the cross section BB' (as shown in FIG. 7b) of the sensor package.

FIGS. 7d and 7e show cross sections of the above mentioned sensor package. FIG. 7d shows the cross section AA' (shown in FIG. 7b) of the sensor package with metal lines 8 partially covered by the underfill material 14, connecting the inner pads 25 to pads 6 on the periphery of the substrate 2. FIG. 7e shows the cross section BB', with the dummy bumps 23 used for bonding the cap 22 to the substrate 2.

Figure 8:
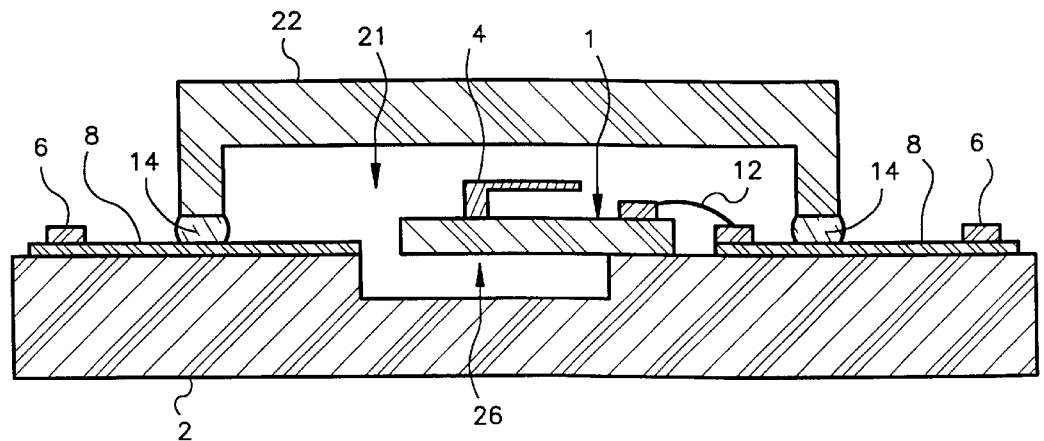
FIG. 8 illustrates a sensor chip bonded to a substrate, where the sensor chip is places on top of a cavity etched in the substrate.

For some applications, (e.g. accelerometers), having the sensing element mounted 4 on the substrate 2, would result in problems caused by thermal mismatch. For such applications, a cavity 26 can be created in the substrate 2, and the sensor chip I will be mounted on the substrate, on top of the cavity 26. For example this is done in such a way that the sensing element 4 is placed over the cavity 26, and at least one side of the sensor chip is attached to the substrate. Wire bonding or flip chip bonding methods may be used for connecting the sensor pads 24 to pads 25 on the substrate 2. As mentioned above, these pads 25 can be connected via metal lines 8 to bonding pads 6 on the outer edge of the substrate 2. A cap 22 can be used for providing a controlled pressure environment. The cap 22 can be bonded to the substrate 2 using dummy bumps 23, as mentioned before. The underfill material 14 applied around the dummy bumps 23 will provide a great method for sealing the area under the cap and providing a controlled pressure environment for the sensing element to operate in. The top view of this package would be similar to that shown in FIG. 7b. The cross section AA' of this design is shown in FIG. 8. The BB' cross section would be similar to that shown in FIG. 7e.

Once again, as noted above, the electronic circuitry can be either integrated on the same sensor chip I or fabricated separately and attached to the substrate 2 either on the outside periphery or located inside the cap 22. The leads from the electronic chip can be transferred to the outer pads using the same methods used for transferring the sensor leads. Also if needed, additional encapsulant material can be deposited around the underfill area to protect it from the environment. One or several protective layers can also be deposited on a parts of the sensor package or the entire sensor package to protect the metal lines and pads, and the underfill material from the ambient environment.

It is to be understood that the invention is not limited to the exact construction illustrated and described above, but that various changes and modifications may be made without departing from the spirit and the scope of the invention. It should also be noted that there are many different techniques for flip chip bonding that are well known in the art, and our technique of using flip chip bonding for packaging of sensors is not restricted to any specific flip chip bonding method.

We claim:

1. A method of packaging a sensor unit having an active face which includes a sensor element on the active face of said sensor unit, said method comprising the steps of:

providing a substrate having a rear surface, a front surface, and electrical connection means on said rear surface;

forming a cavity in said substrate;

locating said sensor unit over said substrate, with said active face facing in the direction of said rear surface of said substrate, and said sensor element over said cavity;

electrically connecting said sensor unit to said electrical connection means;

securing said sensor unit to said substrate;

dispensing an underfill material at an interface between said sensor unit and said substrate;

due to capillary force on said underfill material, drawing said underfill material between said interface such that said underfill material fills at least a portion of said interface between said sensor unit and said substrate without covering said sensor element; and forming a seal at said interface between said sensor unit and said substrate, said seal completely circumscribing said sensor element and isolating said sensor element and said cavity from said rear surface of said substrate.

2. The method of claim 1 wherein said underfill material completely fills said interface between said sensor unit and said substrate.

3. The method of claim 1 wherein said substrate has formed thereon more than one cavity, and several sensor units are attached to said substrate such that said sensor elements of each sensor unit is located over corresponding cavities.

4. The method of claim 1 wherein said a cavity is formed as an aperture extending completely through said substrate.

5. The method of claim 4 wherein said underfill material is applied at said interface from said rear surface of said substrate.

6. The method of claim 4 wherein said underfill material is applied at said interface from said front side of said substrate through said cavity.

7. The method of claim 4 further comprising the step of securing a screen to said front side of said substrate, such that said screen covers said cavity and protects said sensor element.

8. The method of claim 7 wherein said screen is porous.

9. The method of claim 7 wherein said screen is non-porous.

10. The method of claim 4 further comprising the step of encapsulating within an encapsulant layer that portion of said underfill material adjacent to said sensor element and exposed to said cavity to protect said underfill material.

11. The method of claim 10 further comprising the step of covering said rear surface of said substrate and a surface of said sensor unit opposite of said sensor element with at least one protective layer.

12. The method of claim 10 further comprising the step of covering said rear surface of said substrate and a surface of said sensor unit opposite of said sensor element with at more than one protective layer.

13. The method of claim 10 further comprising the step of covering at least a portion of said underfill material adjacent to said sensor element and exposed to said cavity and of said encapsulant layer with at least one protective layer.

14. The method of claim 13 wherein said protective layer also covers said sensor element and said protective layer is formed sufficiently thin so as to permit operation of said sensor element.

15. The method of claim 13 wherein said protective layer also covers said front surface of said substrate.

16. The method of claim 14 wherein protective layer further covers said front surface of said substrate.

17. The method of claim 15 wherein said protective layer further covers said rear surface of said substrate and a surface of said sensor unit opposite of said sensor element.

18. The method of claim 17 wherein said front and rear surfaces are covered with protective layers of different materials.

19. The method of claim 4 further comprising the step of covering said rear surface of said substrate and a surface of said sensor unit opposite of said sensor element with at least one protective layer.

20. The method of claim 4 further comprising the step of covering said rear surface of said substrate and a surface of said sensor unit opposite of said sensor element with more than one protective layer.

21. The method of claim 4 further comprising the step of covering a portion of said underfill material adjacent to said sensor element and exposed to said cavity with at least one protective layer.

22. The method of claim 21 wherein said protective layer also covers said sensor element and said protective layer is formed sufficiently thin so as to permit operation of said sensor element.

23. The method of claim 21 wherein all of said underfill material adjacent to said sensor element and exposed to said cavity is covered with said protective layer.

24. The method of claim 21 wherein said protective layer also covers said front surface of said substrate.

25. The method of claim 24 further comprising the step of encapsulating within an encapsulant layer all of said underfill material adjacent to said sensor element and exposed to said cavity.

26. The method of claim 24 wherein said step of covering with at least one protective layer also covers said rear surface of said substrate and a surface of said sensor unit opposite of said sensor element.

27. The method of claim 26 wherein said front and rear surfaces are covered with protective layers of different materials. sensor unit opposite of said sensor element.

28. The method of claim 26 further comprising the step of encapsulating within an encapsulant layer all of said underfill material adjacent to said sensor element and exposed to said cavity.

29. The method of claim 21 further comprising the step of encapsulating within an encapsulant layer all of said underfill material adjacent to said sensor element and exposed to said cavity.

30. The method of claim 1 wherein said step of electrically connecting said sensor unit is through flip chip bonding.

31. The method of claim 30 wherein said step of securing said sensor unit to said substrate is through flip chip bonding.

32. The method of claim 30 wherein said step of electrically connecting said sensor unit to said electrical connection means also secures said sensor unit to said substrate.

33. The method of claim 30 wherein at least one of said sensor unit and said substrate are formed with bumps, some of said bumps being used for electrically connecting said sensor unit to said substrate, and others of said bumps being used for securing said sensor unit to said substrate.

34. The method of claim 1 wherein said step of securing said sensor unit to said substrate is through flip chip bonding.

35. The method of claim 4 wherein said step of electrically connecting said sensor unit is through flip chip bonding.

36. The method of claim 35 wherein said step of securing said sensor unit to said substrate is through flip chip bonding.

37. The method of claim 35 wherein said step of electrically connecting said sensor unit to said electrical connection means also secures said sensor unit to said substrate.

38. The method of claim 35 wherein at least one of said sensor unit and said substrate are formed with bumps, some of said bumps being used for electrically connecting said sensor unit to said substrate, and others of said bumps being used for securing said sensor unit to said substrate.

39. The method of claim 4 wherein said step of securing said sensor unit to said substrate is through flip chip bonding.

40. The method of claim 1 further comprising the steps of:
providing electronic circuitry means;
securing said electronic circuitry means to said rear surface of said substrate;
coupling said electronic circuitry means to said sensor unit.

41. The method of claim 40 wherein said electronic circuitry means includes at least one integrated circuit chip secured to said rear surface of said substrate by flip chip bonding.

42. The method of claim 40 wherein said electronic circuitry means includes at least one integrated circuit chip secured to said rear surface of said substrate by wire bonding.

43. The method of claim 40 wherein said electronic circuitry means includes at least one integrated circuit chip secured to rear surface of said substrate by flip chip bonding and at least one integrated circuit chip secured to rear surface of said substrate by wire bonding.

44. The method of claim 4 further comprising the steps of:
providing electronic circuitry means;
securing said electronic circuitry means to said rear surface of said substrate;
coupling said electronic circuitry means to said sensor unit.

45. The method of claim 44 wherein said electronic circuitry means includes at least one integrated circuit chip secured to said rear surface of said substrate by flip chip bonding.

46. The method of claim 44 wherein said electronic circuitry means includes at least one integrated circuit chip secured to said rear surface of said substrate by wire bonding.

47. The method of claim 44 wherein said electronic circuitry means includes at least one integrated circuit chip secured to rear surface of said substrate by flip chip bonding and at least one integrated circuit chip secured to rear surface of said substrate by wire bonding.

48. The method of claim 4 further comprising the step of fabricating said electronic circuitry on said sensor unit along with said sensor element, creating a monolithic sensor unit.

49. The method of claim 4 wherein said sensor unit is a packaged monolithic sensor unit.

50. The method of claim 4 wherein said sensor unit is a microsensor chip.

51. The method of claim 4 wherein said sensor unit is a packaged microsensor unit.

52. The method of claim 4 wherein said sensor unit is a packaged hybrid sensor unit, having at least one microsensor chip and at least one electronic chip.

53. The method of claim 1 wherein said sensor unit is a monolithic sensor unit having said electronic circuitry fabricated on said sensor unit along with said sensor element.

54. The method of claim 1 wherein said sensor unit is a packaged monolithic sensor unit.

55. The method of claim 1 wherein said sensor unit is a microsensor chip.

56. The method of claim 1 wherein said sensor unit is a packaged microsensor unit.

57. The method of claim 1 wherein said sensor unit is a packaged hybrid sensor unit, having at least one microsensor chip and at least one electronic chip.

58. The method of claim 4 wherein said sensor element is a pressure sensor.

59. The method of claim 1 wherein said a cavity is formed as a recess extending less than completely through said substrate.

60. The method of claim 59 wherein said underfill material is applied at said interface from said rear surface of said substrate.

61. The method of claim 59 further comprising the step of encapsulating within a protective layer, a rearwardly exposed portion of said underfill material.

62. The method of claim 61 further comprising the step of covering said rear surface of said substrate and said sensor unit with at least one protective layer.

63. The method of claim 62 wherein said step of covering with at least one protective layer also covers said front surface of said substrate.

64. The method of claim 63 wherein said encapsulating layer is beneath said protective layer.

65. The method of claim 63 wherein said protective layer is beneath said encapsulating layer.

66. The method of claim 63 wherein said front and rear surfaces are covered with different materials.

67. The method of claim 59 further comprising the step of covering said rear surface of said substrate and said sensor unit with at least one protective layer.

68. The method of claim 59 wherein said step of covering with at least one protective layer also covers said front surface of said substrate.

69. The method of claim 59 wherein said step of electrically connecting said sensor unit to step substrate is through flip chip bonding.

70. The method of claim 69 wherein said step of securing said sensor unit to said substrate is through flip chip bonding.

71. The method of claim 69 wherein said step of electrically connecting said sensor unit to said electrical connection means also secures said sensor unit to said substrate.

72. The method of claim 69 wherein at least one of said sensor unit and said substrate are formed with bumps, some of said bumps being used for electrically connecting said sensor unit to said substrate, and others of said bumps being used for securing said sensor unit to said substrate.

73. The method of claim 59 wherein said step of securing said sensor unit to said substrate is through flip chip bonding.

74. The method of claim 59 further comprising the steps of providing electronic circuitry means and securing said electronic circuitry means to said rear surface of said substrate and coupled to said sensor unit.

75. The method of claim 74 wherein said electronic circuitry means includes at least one integrated circuit chip being secured to said rear surface of said substrate by wire bonding.

76. The method of claim 74 wherein said electronic circuitry means includes at least one integration circuit chip being secured to rear surface of said substrate by flip chip bonding and at least one integrated circuit chip being secured to rear surface of said substrate by wire bonding.

77. The method of claim 59 wherein said electronic circuitry means includes at least one integrated circuit chip being secured to said rear surface of said substrate by flip chip bonding.

78. The method of claim 59 wherein said sensor unit is a monolithic sensor unit having said electronic circuitry fabricated on said sensor unit along with said sensor element.

79. The method of claim 59 wherein said sensor unit is a packaged monolithic sensor unit.

80. The method of claim 59 wherein said sensor unit is a microsensor chip.

81. The method of claim 59 wherein said sensor unit is a packaged microsensor chip.

82. The method of claim 59 wherein said sensor unit is a packaged hybrid sensor chip, with at least one microsensor chip and at least one electronic chip.

83. The method of claim 59 wherein said sensor is an accelerometer.

84. The method of claim 59 wherein said sensor is a member of the gyroscope family.

85. A method of packaging a sensor unit having an active face which includes a sensor element on the active face of said sensor, said method comprising the steps of:
   providing a substrate having a rear surface, a front surface, and electrical connection means on said rear surface;
   forming a cavity in said substrate, said a cavity being formed as an aperture extending completely through said substrate;
   locating said sensor unit over said substrate, with said active face facing in the direction of said rear surface of said substrate, and said sensor element over said cavity;
   electrically connecting said sensor unit to said electrical connection means;
   securing said sensor unit to said substrate;
   dispensing an underfill material at an interface between said sensor unit and said substrate;
   due to capillary force on said underfill material, drawing said underfill material between said interface such that said underfill material fills at least a portion of said interface between said sensor unit and said substrate without covering said sensor element; and
   forming a seal at said interface between said sensor unit and said substrate, said seal completely circumscribing said sensor element and isolating said sensor element and said cavity from said rear surface of said substrate; and
   forming a cover over said electronic connection means of said sensor unit, said cover extending from said sensor element at one end and terminating at another end within said underfill material such that said electrical connection means of said sensor unit is isolated from a sensed environment.

86. The method of claim 85 wherein said cover is formed of silicon.

87. The method of claim 85 wherein said cover is formed of boron doped silicon.

88. The method of claim 85 wherein said cover is spaced apart from said electrical connection means so as to not make contact therewith.

89. The method of claim 88 wherein said cover is formed of silicon.

90. The method of claim 88 wherein said cover is formed of boron doped silicon.

91. The method of claim 88 wherein at least one protective layer is deposited on said cover.

92. The method of claim 85 wherein said cover is in contact with said electrical connection means.

93. The method of claim 92 wherein said cover is formed of silicon.

94. The method of claim 92 wherein said cover is formed of boron doped silicon.

95. The method of claim 92 wherein at least one protective layer is deposited on said cover.

96. The method of claim 85 wherein at least one protective layer is deposited on said cover.

97. A method of packaging a sensor unit having an active face which includes a sensor element on the active face of said sensor unit, said method comprising the steps of:
   providing a substrate having a rear surface, a front surface, and electrical connection means on said rear surface;
   forming a cavity in said substrate, said a cavity being formed as an aperture extending completely through said substrate;
   locating said sensor unit over said substrate, with said active face facing in the direction of said rear surface of said substrate, and said sensor element over said cavity;
   electrically connecting said sensor unit to said electrical connection means;
   securing said sensor unit to said substrate;
   dispensing an underfill material at an interface between said sensor unit and said substrate;
   due to capillary force on said underfill material, drawing said underfill material between said interface such that said underfill material fills at least a portion of said interface between said sensor unit and said substrate without covering said sensor element; and
   forming a seal at said interface between said sensor unit and said substrate, said seal completely circumscribing said sensor element and isolating said sensor element and said cavity from said rear surface of said substrate; and
   depositing a protective layer over said electrical connection means of said sensor unit, said protective layer extending from said sensor element at one end and terminating at another end within said underfill material such that said electrical connection means of said sensor unit is isolated from a sensed environment.

98. A method of packaging a sensor unit having an active face which includes a sensor element on said active face of said sensor unit, said method comprising the steps of:
   providing a substrate having a rear surface, a front surface, and electrical connection means on said rear surface;
   forming a cavity in said substrate, said electrical connection means having at least one end terminating on said portion at least partially defining said cavity;
   locating said sensor unit over said cavity with said active face facing in a direction away from said rear surface of said substrate;
   securing said sensor unit to said substrate;
   electrically connecting said sensor unit to said electrical connection means;
   placing a cap on said rear surface of said substrate and over said sensor unit to completely enclose said sensor unit therein, said cap and said portion of said substrate defining said cavity;
   securing said cap to said substrate through non-conductive connecting bumps formed on at least one of said cap and said substrate; and
   dispensing an underfill material at an interface between said cap and said substrate;
   due to the existing capillary force on said underfill material and said interface between said sensor unit and said substrate, drawing said underfill material between said interface whereby said underfill material fills said interface between said sensor unit and said substrate without covering said sensor element, and forming a seal at said interface between said sensor unit and said substrate, said seal completely circumscribing said sensor element and isolating said sensor element and said cavity from said rear surface of said substrate.

99. The method of claim 98 wherein said cavity extends less than completely through said substrate.

100. The method of claim 98 wherein said sensor element is provided as an accelerometer.

101. The method of claim 98 wherein said sensor element is a member of the gyroscope family.

102. The method of claim 98 further comprising the step of establishing a controlled environment within said cavity beneath said cap.

103. The method of claim 98 further compromising the step of sealing the interface between said substrate and said cap to provide a controlled environment within said cavity.

* * * * *

UNITED STATES PATENT AND TRADEMARK OFFICE
CERTIFICATE OF CORRECTION

PATENT NO.    : 6,140,144                                          Page 1 of 1
DATED         : October 31, 2000
INVENTOR(S)   : Nader Najafi It is certified that error appears in the above-identified patent and that said Letters Patent is hereby corrected as shown below:

Column 12, claim 27,
Line 34, after "materials." please delete "sensor unit opposite of said sensor element".

Signed and Sealed this

Eighteenth Day of December, 2001

Attest:

JAMES E. ROGAN
Attesting Officer    Director of the United States Patent and Trademark Office